US006646878B2

(12) United States Patent
Chan (10) Patent No.: US 6,646,878 B2
(45) Date of Patent: Nov. 11, 2003

(54) FAIL SAFE COOLING SYSTEM

(75) Inventor: Johni Chan, Rancho Santa Fe, CA (US)

(73) Assignee: I-Bus Corporation, San Jose, CA (US)

( * ) Notice: Subject to any disclaimer, the term of this patent is extended or adjusted under 35 U.S.C. 154(b) by 0 days.

(21) Appl. No.: 09/907,511

(22) Filed: Jul. 16, 2001

(65) Prior Publication Data

US 2003/0011989 A1 Jan. 16, 2003

(51) Int. Cl.[7] .................................................. H05K 7/20
(52) U.S. Cl. ........................................ 361/695; 454/184
(58) Field of Search ....................... 165/80.3, 121–122; 361/687–697; 454/184, 253, 258; 62/259.2

(56) References Cited

U.S. PATENT DOCUMENTS

| 3,967,874 | A | | 7/1976 | Calabro |
|---|---|---|---|---|
| 4,399,485 | A | * | 8/1983 | Wright et al. ............... 361/369 |
| 4,648,007 | A | | 3/1987 | Garner |
| 4,674,004 | A | * | 6/1987 | Smith et al. ................ 361/695 |
| 5,528,454 | A | | 6/1996 | Niklos |
| 5,751,549 | A | | 5/1998 | Eberhardt et al. |
| 5,949,646 | A | | 9/1999 | Lee et al. |
| 6,000,464 | A | * | 12/1999 | Scafidi et al. ............... 165/80.3 |
| 6,000,623 | A | | 12/1999 | Blatti et al. |
| 6,021,042 | A | | 2/2000 | Anderson et al. |
| 6,061,237 | A | | 5/2000 | Sands et al. |
| 6,108,203 | A | | 8/2000 | Dittus et al. |
| 6,135,875 | A | | 10/2000 | French |
| 6,181,557 | B1 | | 1/2001 | Gatti |
| 6,384,325 | B1 | * | 5/2002 | Chastain et al. ............ 454/184 |

FOREIGN PATENT DOCUMENTS

| JP | 2-237098 | 9/1990 |
|---|---|---|
| JP | 4-209598 | 7/1992 |

* cited by examiner

Primary Examiner—Gregory Thompson
(74) Attorney, Agent, or Firm—Thomas F. Lebens; Fitch, Even, Tabin & Flannery (57) ABSTRACT

A method for cooling electronic components comprising drawing air into a chassis; causing the air to come in contact with a corrugated deflector; and cooling electronic components with the air before the air exits the chassis. A fail safe system for cooling electronic components comprising a corrugated deflector; a plurality of fans, positioned such that they cause air to come in contact with the corrugated deflector; and an electronic component; wherein the electronic component is cooled by the air.

19 Claims, 10 Drawing Sheets

FAIL SAFE COOLING SYSTEM

BACKGROUND OF THE INVENTION

The present invention relates to the operation of a cooling system, and more particularly to the operation of a cooling system to cool electronic components. Even more particularly, the present invention relates to the cooling of electronic components with a cooling system that incorporates, a plurality of fans, a corrugated deflector and an exhaust blower.

It is well known in the art that electronic components can overheat if not provided with a working cooling system. It is also well known in the art that passing air over the electronic components by the use of a fan or blower can be sufficient to keep the components from overheating.

There is a continuing need for a cooling system that will continue to cool many electronic components even upon the failure of one or more fans. The present invention advantageously addresses the above and other needs.

SUMMARY OF THE INVENTION

The present invention advantageously addresses the needs above as well as other needs by providing a cooling system including a plurality of fans, blowers, a corrugated deflector, and directional air deflectors.

In one embodiment, the invention can be characterized as method for cooling electronic components comprising drawing air into a chassis; causing the air to come in contact with a corrugated deflector; and cooling electronic components with the air before the air exits the chassis.

In another embodiment, the invention can be characterized as a fail safe system for cooling electronic components comprising a corrugated deflector; a plurality of fans, positioned such that they cause air to come in contact with the corrugated deflector; and an electronic component; wherein the electronic component is cooled by the air.

In another embodiment, the invention can be characterized as a fail safe system for cooling electronic components comprising a corrugated deflector coupled to a chassis; a directional air deflector coupled to the chassis; a plurality of fans, positioned such that they cause air to come in contact with the corrugated deflector and the directional air deflector; and an electronic component; wherein the electronic component is cooled by the air.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

Figure 1:
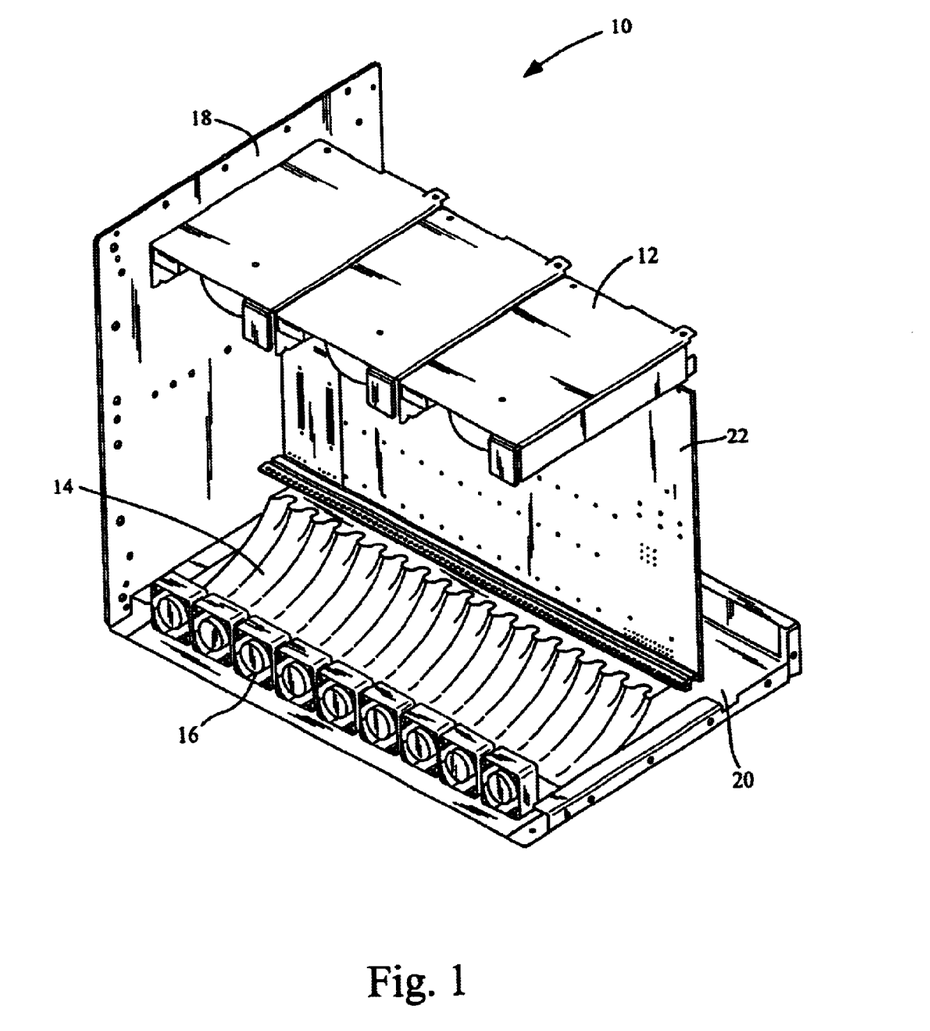
FIG. 1 is a perspective view of a cooling system in accordance with one embodiment of the present invention.

Referring to FIG. 1, shown is a perspective view of a cooling system in accordance with one embodiment of the present invention. Shown is the cooling system 10, three exhaust blowers 12, a corrugated deflector 14, nine fans 16, a chassis 18, a bottom 20 of the chassis 18, and a backplane 22. Not shown are electronic components on electronic boards 24 the cooling system 10 is designed to cool.

The nine fans 16 are coupled to the bottom 20 of the chassis 18 and are mounted vertically inside the chassis 18. The corrugated deflector 14 is also coupled to the bottom 20 of the chassis 18. A front edge of the corrugated deflector 14 is also coupled to a front edge of the chassis 18 at the bottom 20 of the chassis 18. The corrugated deflector 14 curves from the bottom 20 of the chassis 18 upward toward the backplane 22 and a back edge of the corrugated deflector 14 is coupled to the backplane 22. The backplane 22 is also coupled to the chassis 18 about midway through the depth of the chassis. Above the backplane 22 and coupled to the chassis 18 are the three exhaust blowers 12.

A front edge of the corrugated deflector 14 is flat, i.e., it is not corrugated, while a rear edge of the corrugated deflector 14 is corrugated. Portions of the corrugated deflector 14 between the front edge and the rear edge transition from flat to corrugated. The corrugated deflector 14 also curves up from the bottom 20 of the chassis 18, such that the front edge is substantially at the bottom 20 of the chassis 18, while the rear edge is at a height approximately equal to top edges of the nine fans 16.

Figure 4:
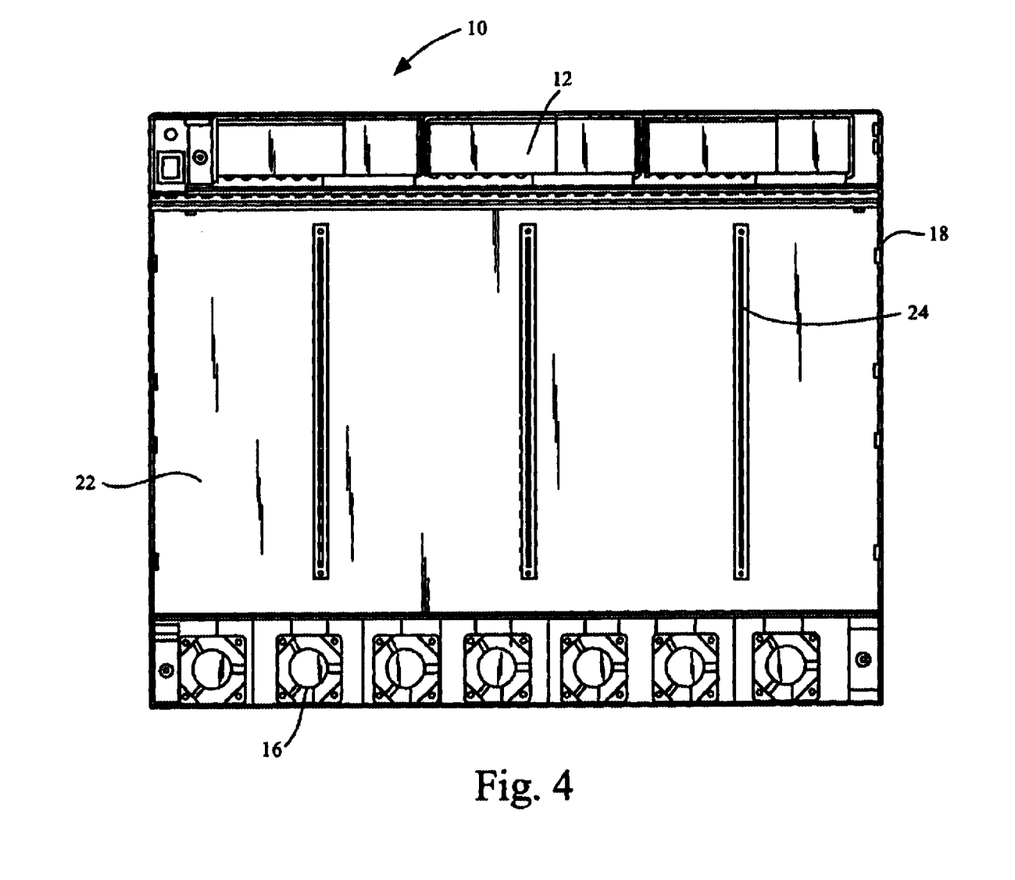
FIG. 4 is a front-view of the cooling system of FIG. 1 with electronic boards attached to the chassis.

Under normal operation, the nine fans 16 draw air from outside the chassis 18 into the chassis 18 and direct airflow at the corrugated deflector 14. The corrugated deflector 14, herein also the deflector 14, causes lateral, i.e., sideways, turbulence in the air such that the air mixes and flows in many directions. The curvature of the deflector 14 also causes the air to move in an upward direction toward the exhaust blowers 12. In normal operation, this would cause air to flow over electronic boards 24 that extend from the backplane 22 and contain electronic components such as, for example, a hard drive. The electronic boards 24 are shown in FIG. 4. The air then flows out of the chassis 18 through the exhaust blowers 12. The exhaust blowers 12 also act to cause air to be drawn out of the chassis 18.

In an alternative embodiment the number of fans 16 and the number of exhaust blowers 12 could be more or less than nine and three, respectively, and the mechanical relationship between the corrugated deflector 14, the backplane 22, and the chassis 18 may differ.

The deflector 14, in one embodiment is a molded piece of sheet metal. The deflector 14 is corrugated such that it causes lateral turbulence in the air flow, causing the air to move laterally (sideways) relative to the direction in which the air is blown by the nine fans 16, and otherwise directed by the corrugated deflector 14. The upward curvature of the corrugated deflector 14 causes the air to be deflected in an upward direction over the electronic boards 24.

Figure 2:
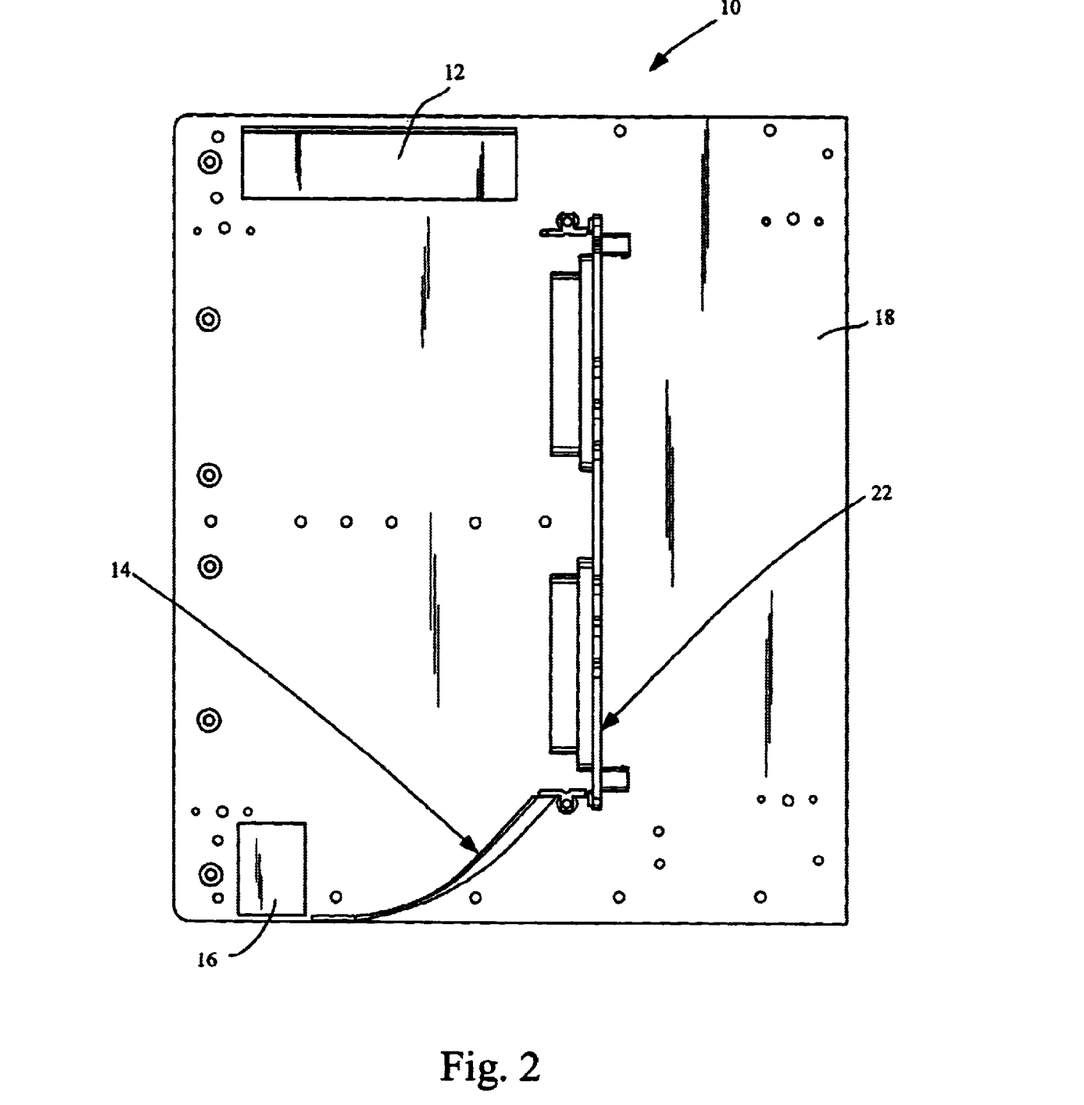
FIG. 2 is a side-view of the cooling system of FIG. 1.

Referring to FIG. 2, shown is side-view of the cooling system 10 of FIG. 1. Shown is the cooling system 10, one of the exhaust blowers 12, one of the fans 16, the corrugated deflector 14, the backplane 22, and the chassis 18.

The corrugated deflector 14 is shown coupled to the backplane 22 and to the bottom 20 of the chassis 18. The curvature of the corrugated deflector 14 along with the uneven surface of the corrugated deflector 14 cause turbulence in the air that will flow over the electronic components. While the corrugated deflector 14 is shown coupled to the backplane 22, the corrugated deflector 14 could also be coupled to the chassis 18 or to an electronic board 24.

Figure 10:
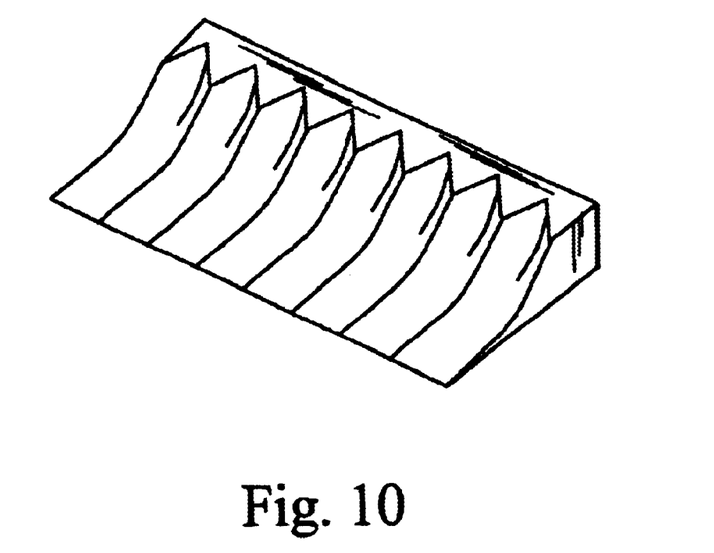
FIG. 10 is a perspective view of a corrugated deflector with pointed grooves.
Figure 11:
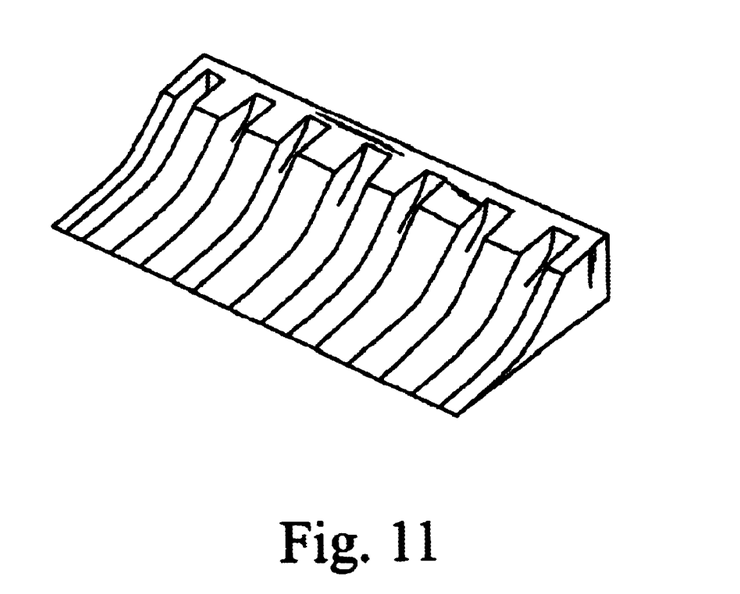
FIG. 11 is a perspective view of a corrugated deflector with square grooves.

The corrugated deflector 14 shown has parallel rounded grooves. This causes turbulence in the air flowing through the chassis 18. The corrugated deflector 14 could also be shaped, for example, with ridged, pointed, or squared grooves. FIGS. 10 and 11 show such alternative embodiments of a corrugated deflector 14. Additionally the grooves do not need to be perfectly parallel to cause turbulence in the air.

Figure 3:
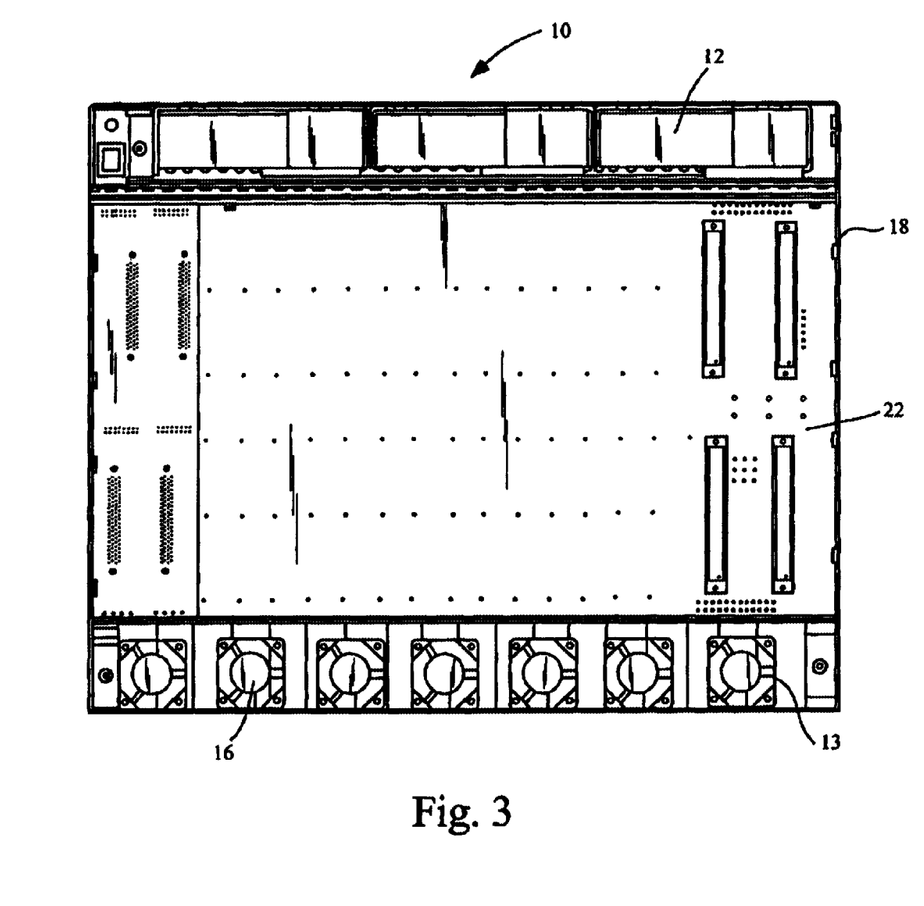
FIG. 3 is a front-view of the cooling system of FIG. 1.

Referring to FIG. 3, shown is a front-view of the cooling system 10 of FIG. 1. Shown is the cooling system 10, the seven fans 16, the backplane 22, the chassis 18, speed adjustment circuitry 13, and three exhaust blowers 12.

This embodiment of the present invention shows seven fans 16 instead of nine fans 16. As stated earlier, the present invention can have a variable number of fans 16. In the present embodiment there are a large number of smaller fans 16 drawing air into the chassis 18 from the ambient instead of a small number of larger fans 16. Having a large number of smaller fans 16 prevents having a large change in the volume of air that is flowing through the chassis 18 in the event one of the fans 16 fails. For example, if two large fans 16 are used and one fails, a fifty percent reduction in the amount of air flow may result. Whereas, if ten fans 16 are employed and one fails, only a ten percent reduction in the amount of air flow results. This assumes the speed of the fans 16 is not increased when a failure is detected.

The present invention also advantageously includes circuitry that senses fan failure and adjusts the speed of remaining fans 16 if a failure is detected in one or more fans 16. For example, if there are ten fans 16 and a failure is detected for one of the fans 16, the remaining nine fans 16 will have their speed increased by ten percent to keep the total amount of air flowing through the chassis 18 almost constant. Such circuitry is well known, e.g., see U.S. Pat. No. 6,000,623 and U.S. Pat. No. 5,751,549.

One problem with prior art cooling systems is when a fan fails the electronics that such fan was cooling no longer have air flowing over them. Advantageously, the present invention provides a system for cooling all the electronics within a chassis 18 even upon a fan failure. The corrugated deflector 14 insures air will continue to flow over all the electronic components even upon a fan failure. The turbulence caused by the corrugated deflector 14 causes air to flow over all the electronics even in the event one or multiple fans 16 fail. This is further shown in FIG. 7.

Referring to FIG. 4, shown is a front-view of the cooling system 10 of FIG. 1 with electronic boards coupled to the chassis 18. Shown is the cooling system 10, the fans 16, the exhaust blowers 12, and three electronic boards 24.

The three electronic boards 24 are coupled to the chassis 18 and aligned perpendicular to the backplane 22 and parallel to the deflected turbulent air. The electronic boards 24 are above the corrugated deflector 14 such that the deflected turbulent air flows up through spaces between the three electronic boards 24. Although the three electronic boards 24 are shown aligned perpendicular to the backplane 22 they could be aligned in any direction without departing from the present invention. There could also be any number of electronic boards 24 within the chassis 18. The size of the chassis 18, also is independent of the invention, and could be very small or very large.

Figure 5:
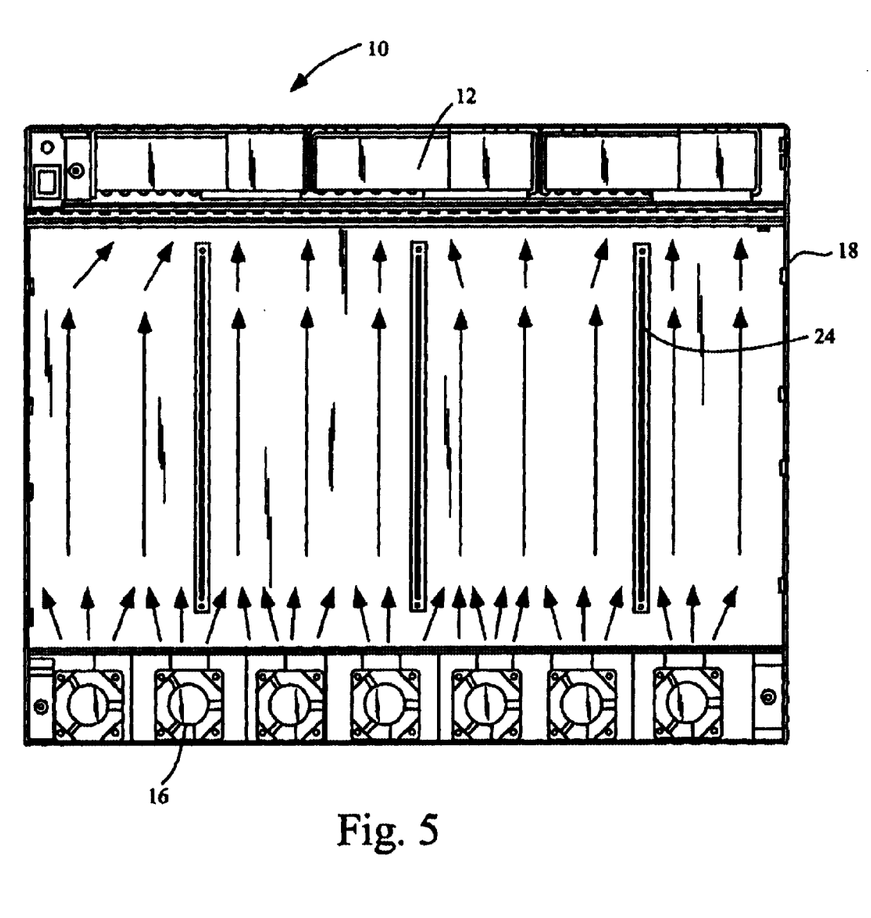
FIG. 5 is the front-view of the cooling system of FIG. 1, showing the air flow through the chassis.

Referring to FIG. 5, shown is a front-view of the cooling system 10 of FIG. 1 showing the air flow through the chassis 18. Shown is the cooling system 10, the fans 16, the exhaust blowers 12, three electronic boards 24, and the air flow represented by arrows.

The air is drawn into the chassis 18 by the fans 16 from the ambient. The air hits the corrugated deflector 14 which causes turbulence in the air. The air is also deflected in an upward direction by the curvature of the corrugated deflector 14. Additionally, the optional exhaust blowers 12 help to cause the air to exit the chassis 18. The corrugated deflector 14 causes the air to rise in many directions, thus causing air to flow over all of the electronic components in the chassis 18 before exiting the chassis 18 through the exhaust blowers 12. In another embodiment of the present invention the fans 16 could be located on the top of the chassis 18 with the corrugated deflector 14 curved downward, thus causing air to flow down over the electronic components. The corrugated deflector 14 would still cause turbulence in the air allowing it to flow over all the electronic components. Upward flow is consistent with convention currents created as the air is heated by components on the electronic boards 24.

Only three electronic boards 24 are shown, however, any configuration housing electronic components could be utilized in the present invention. As more boards are added the corrugated deflector 14 works to direct air sideways, making sure air flows between all the electronic boards 24, thus adequately cooling all the electronic components within the chassis 18. As shown, the air flows from the fans 16, over the electronic components located on the electronic boards 24, and out the exhaust blowers 12. Even in the event a fan 16 fails, air will still flow to over all the electronic components. This is more clearly shown and described with reference to FIG. 7.

Figure 6:
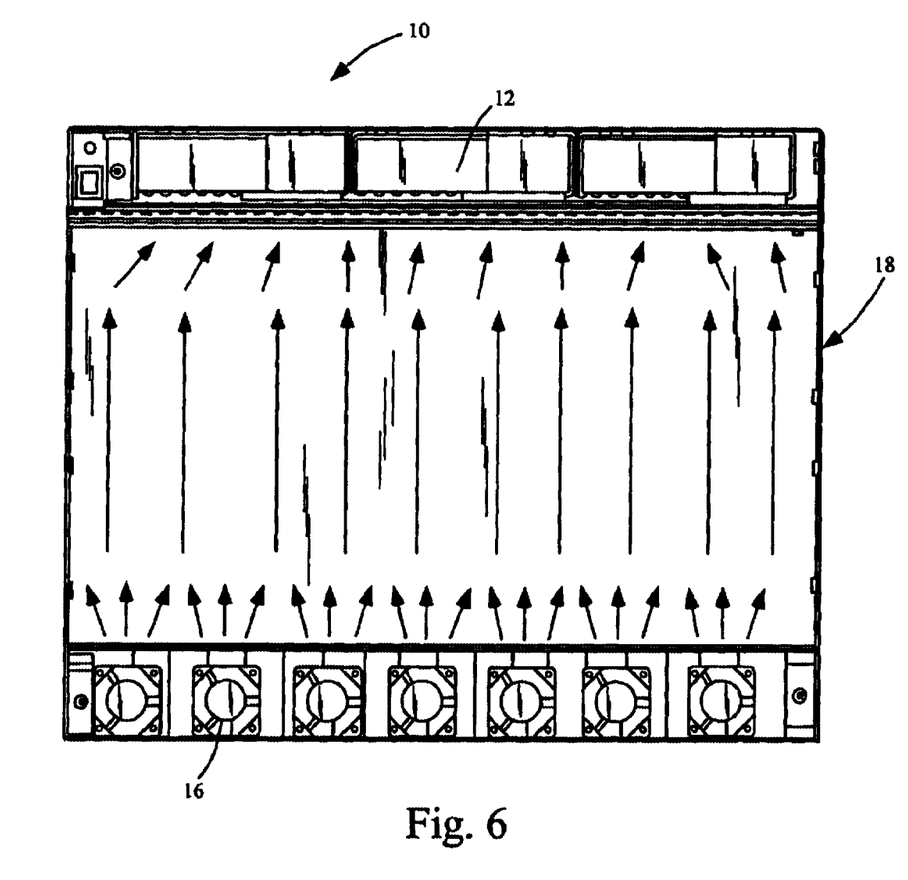
FIG. 6 is a front-view of the cooling system of FIG. 1 showing the air flow through the chassis.

Referring to FIG. 6, shown is a front-view of the cooling system 10 of FIG. 1 showing the air flow through the chassis 18. Shown is the cooling system 10, the seven fans 16, the three exhaust blowers 12, and the air flow represented by arrows.

Shown is the air flow through the chassis 18 when all of the seven fans 16 are properly functioning. As shown the air at the bottom of the chassis 18 is coming up from the corrugated deflector 14 in many directions, not only the original direction the fan 16 was blowing the air. This is caused by the turbulence in the air, caused by the corrugated deflector 14. The air then proceeds to flow up through the chassis 18, cooling the electronic components, and out of the chassis 18 through the exhaust blowers 12. Optionally, the air could leave the chassis 18 through holes in the top of the chassis 18 rather than through the exhaust blowers 12.

Figure 7:
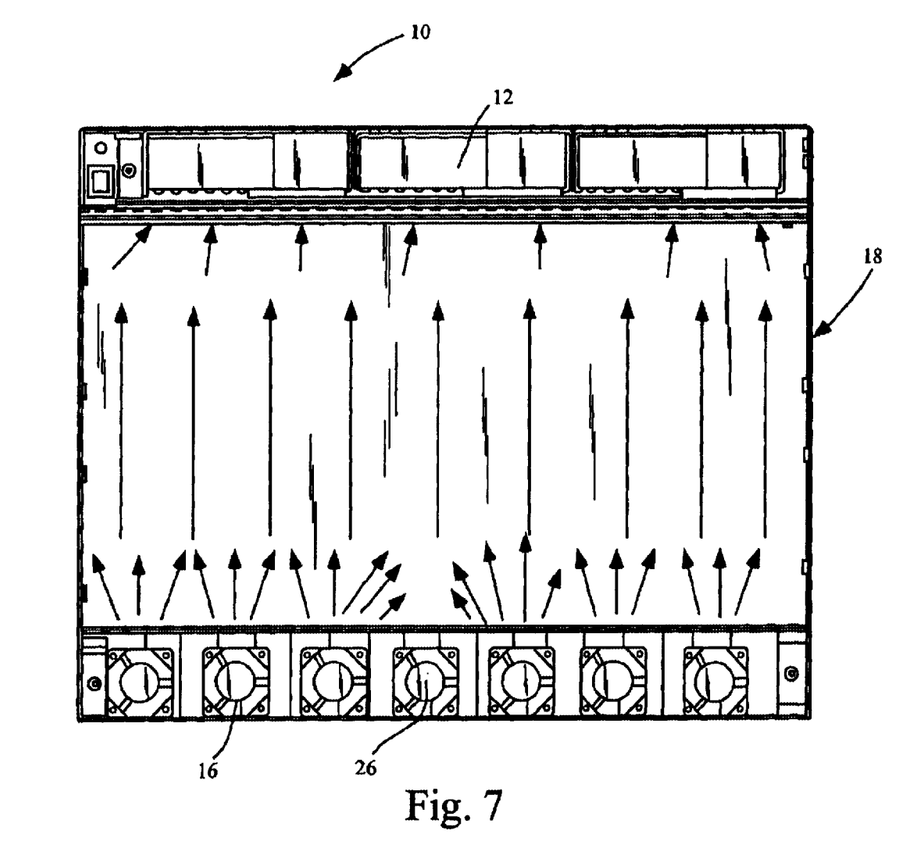
FIG. 7 is a front-view of the cooling system of FIG. 1 showing the air flow through the chassis when one of the fans has malfunctioned.

Referring to FIG. 7, shown is a front-view of the cooling system 10 of FIG. 1 showing the air flow through the chassis 18 when one of the fans 16 has failed. Shown is the cooling system 10, six functioning fans 16, a failed fan 26, the three exhaust blowers 12, and the air flow represented by arrows.

Shown is the air flow through the chassis 18 when only six of the fans 16 are properly functioning. The failed fan 26 is no longer drawing air into the chassis 18. Similarly to FIG. 6, the air at the bottom of the chassis 18 is still coming up from the corrugated deflector 14 in many directions, not only the original direction the fan 16 was blowing the air. This is caused by the turbulence in the air, caused by the corrugated deflector 14. The turbulence in the air will cause air to flow above the failed fan 26. Advantageously, this provides a system that still causes air to flow over all of the electronic components inside the chassis 18 even in the event one or multiple fans 16 fail. The air then proceeds to flow up through the chassis 18, cooling the electronic components, and out of the chassis 18 through the exhaust blowers 12. Optionally, the air could leave the chassis 18 through holes in the top of the chassis 18 rather than through the exhaust blowers 12.

In the event one or multiple fans 16 fail, the speed of the functioning fans 16 can be increased, such that the total amount of air flowing through the chassis 18 remains relatively constant.

Advantageously, the present invention provides for a fail safe cooling system 10, such that electronic components will not overheat in the event of a fan 16 failure.

Additionally, in one embodiment a large number of fans 16 are used to blow air into the corrugated deflector 14, such that in the event of a failure, the amount of air flowing through a chassis 18 is only reduced by a small percentage. Optionally, a smaller number of fans 16 could be used and the speed of the fans 16 increased upon the failure of one of the fans 16, such that the amount of air flowing through the chassis 18 remains relatively constant.

Figure 8:
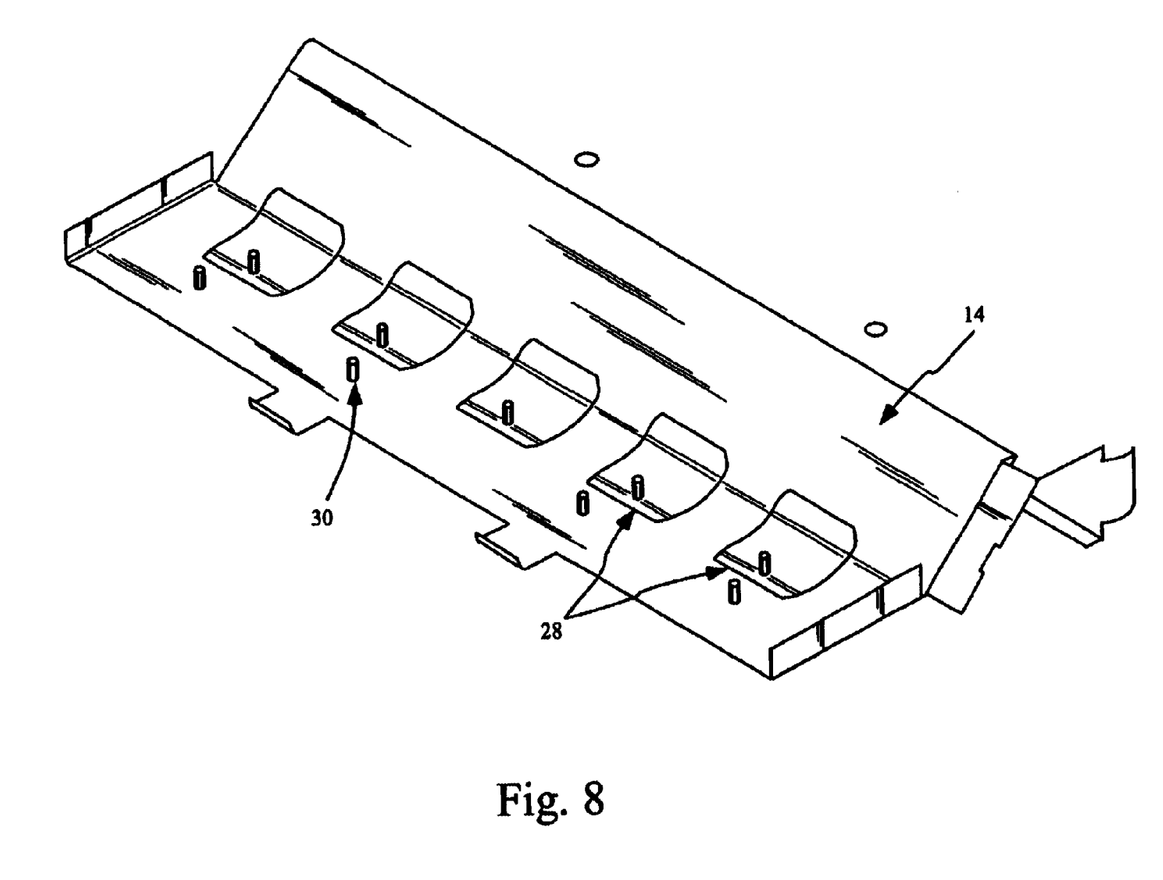
FIG. 8 is a perspective view of a corrugated deflector with directional air deflectors attached.

Referring to FIG. 8, shown is a perspective view of the corrugated deflector with a plurality of directional air deflectors attached. Shown is the corrugated deflector 14, five directional air deflectors 28, and adjustment bolts 30. In FIG. 8, the corrugations in the corrugated deflector 14 are not clearly shown.

The directional air deflector 28, shown, is coupled to the corrugated air deflector 14. The directional air deflector 28, curves upward toward the exhaust blowers 12, such that air will be deflected upward toward the electronic components. Advantageously, the directional air deflectors 28 are made from sheet metal. Optionally, the directional air deflectors 28 could be many different shapes or materials. One or more directional air deflectors 28 could be used to direct air at electronic components that need a relatively greater amount of air flow to keep them from overheating.

The directional air deflectors 28 are coupled to the corrugated air deflector 14 with adjustment bolts 30. The adjustment bolts 30 come up through the corrugated air deflector 28 and through a hole in the directional air deflectors 28. Nuts are then coupled to the adjustment bolts 30 to keep the directional air deflectors 28 in place. There are multiple adjustment bolts 30 each directional air deflector 28 can be coupled to. Shown in FIG. 8 are multiple adjustment bolts 30 that do not go through the directional air deflectors 28. The directional air deflectors can be easily moved to these different adjustment 1 bolts 30 to adjust the direction of the air flow and direct additional air to hot spots. Thus, in the present embodiment there are more adjustment bolts 30 than directional air deflectors 28. However, in another embodiment there could be the same number of adjustment bolts 30 as directional air deflectors 28. The corrugated air deflector 14 optionally can have many additional adjustment bolts 30 in it, such that the directional air deflectors 28 can be adjusted to many different positions within the chassis 18, allowing for precise controlled deflection of the air flowing through the chassis 18. Optionally, the directional air deflectors 28 could be coupled to the chassis 18. Appropriate nuts (not shown), such as lock nuts, wiring nuts, or the like, are used to secure the direction air deflectors 28 to the bolts 30 on the corrugated air defect 14.

The directional air deflectors 28 direct air to predetermined hot spots within the chassis 18. A hot spot is any area within the chassis where the electrical components are more susceptible to overheating, thus requiring a relatively greater amount of air to flow over them. This is an optional feature that may only need to be used when certain electronic components need more air passing over them in order for them to avoid overheating.

The optional directional air deflector 28 deflects air moving horizontally from the fans and redirects it to move in an upward direction, i.e., vertically. This will direct a greater amount of air to specific places on the electronic boards 24, such that electronic components that are more susceptible to overheating have more air flowing over them. This prevents the electronic components from overheating.

Advantageously, the directional air deflectors 28 can be adjusted within the chassis 18 in order to cool different hot spots. The directional air deflectors 28 can be moved closer or farther away from the fans 16. Additionally, the directional air deflectors 28 could be adjusted rotationally to more precisely direct air at hot spots.

Figure 9:
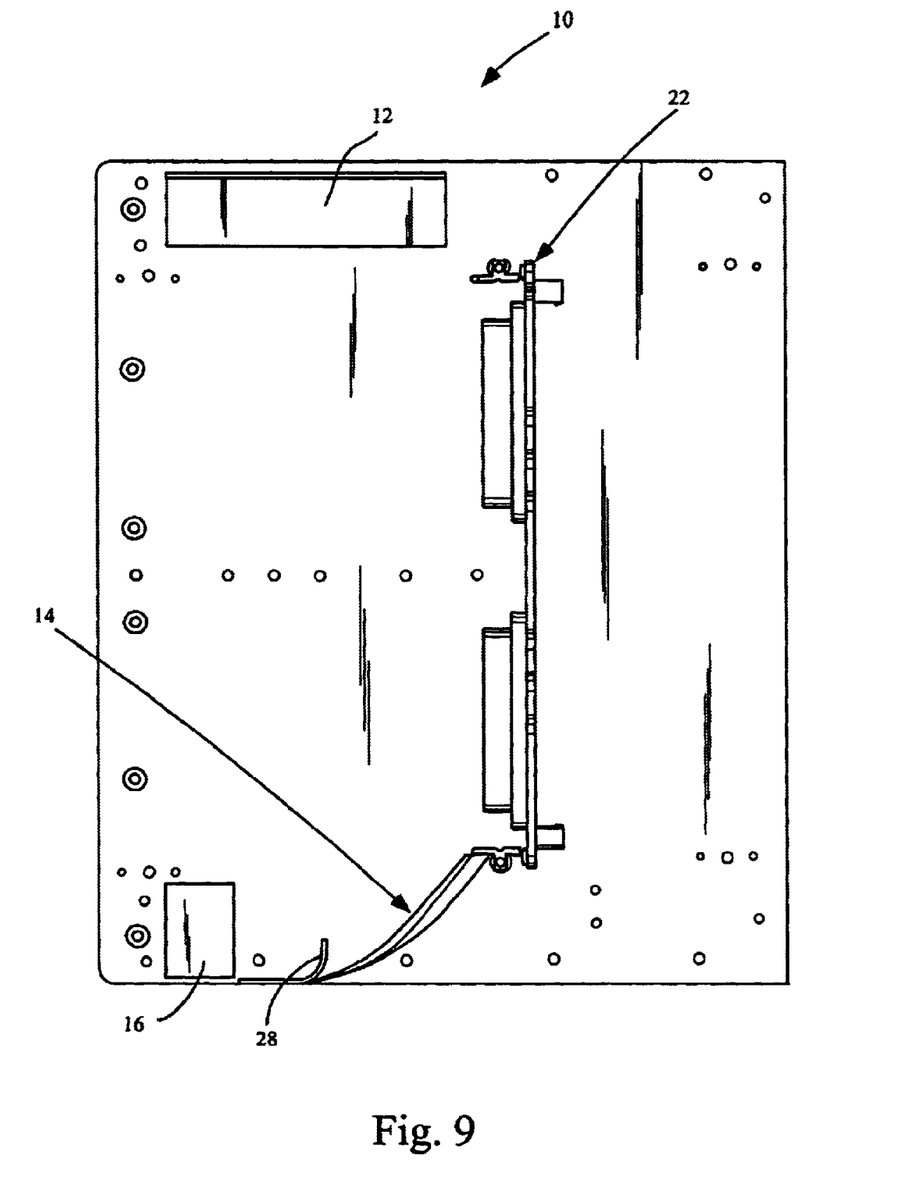
FIG. 9 is a side-view of the cooling system of FIG. 1, showing an attached directional air deflector.

Referring to FIG. 9, shown is a side-view of the cooling system of FIG. 1 showing the optional directional air deflector. Shown is the cooling system 10, the exhaust blower 12, the backplane 22, the corrugated deflector 14, the fan 16, and the directional air deflector 28.

The curvature of the directional air deflector 28 deflects a portion of the air moving in a horizontal direction into a vertical direction. The optional directional air deflector 28 need only be used in systems which have predetermined hot spots, thus requiring a relatively greater amount of airflow over the hot spots to prevent the electronic components from overheating.

Advantageously, the directional air deflectors 28 can be adjusted to tune where the air is flowing inside the chassis 18. The directional air deflectors 28 can be moved in any direction in order to send a relatively greater amount of air to the hot spots. The directional air deflectors 28 can be adjusted to sit closer or farther from fans 16. Additionally, rotational adjustments can be made to the directional air deflectors 28 in order to better direct air to the hot spots. Advantageously, the size and shape of the directional air deflectors 28 can be changed to adjust the amount of air being deflected and the direction of deflection. The tuning of the directional air deflectors 28 can be done at any time should the configuration of the electronic components change. Thus, if a new electronic board 24 is added inside the chassis 18, the directional air deflectors 28 could be tuned to direct air at any hot spots. Additionally, new directional air deflectors 28 could be added to direct air at the new electronic components.

While some air is being deflected by the directional air deflectors 28 the majority of the air coming from the fans 16 passes by the directional air deflector 28 either over the top or by the side of it. The air then comes into contact with the corrugated air deflector 14 and is deflected sideways by the corrugations and horizontally by the upward curvature of the corrugated deflector 14. The corrugations cause the air to move sideways, filling the space behind the directional air deflectors, such that air will still flow over all the electronic components. However, a relatively greater amount of air will be directed to the predetermined hot spots by the directional air deflectors 28.

The corrugated air deflector 14 causes air to move into the areas behind the directional air deflectors 28 because of the sideways turbulence in the air caused by the corrugations. Thus, the combination of the corrugated air deflector 14 and the directional air deflectors 28 allow for an even cooling of a plurality of electronic components in an environment where certain electronic components need more air flow. The cooling system 10 continues to function in the event one or more fans 16 fail to operate.

While the invention herein disclosed has been described by means of specific embodiments and applications thereof, numerous modifications and variations could be made thereto by those skilled in the art without departing from the scope of the invention set forth in the claims.

What is claimed is:

1. A method for cooling electronic components comprising:
   drawing air into a chassis with a plurality of fans;
   causing the air to come in contact with a corrugated deflector which deflects substantially all of the air and causes turbulence in the air such that the air moves horizontally and vertically; and
   cooling a plurality of electronic components with the air before the air exists the chassis;
   wherein the corrugated deflector keeps air flowing over the plurality of electronic components in the event one of the plurality of fans fails.

2. The method of claim 1 further comprising drawing the air out of the chassis through a plurality of blowers.

3. The method of claim 1 further comprising keeping the amount of air flowing through the chassis relatively constant, by adjusting the speed of the plurality of fans in the event one of the plurality of fans fails.

4. The method of claim 1 further comprising blowing the air such that the air contacts a directional air deflector.

5. The method of claim 4 wherein the directional air deflector directs air toward predetermined hot spots within the chassis.

6. The method of claim 1:
   wherein a corrugation on the corrugated deflector causes air to move sideways;
   wherein a curvature on the corrugated deflector causes the air to move vertically.

7. A fail safe system for cooling electronic components comprising:
   a corrugated deflector coupled to a chassis;
   a plurality of fans coupled to the chassis and positioned such that they cause air to come in contact with the corrugated deflector; and
   a plurality of electronic components coupled to a circuit board;
   wherein the plurality of electronic component is cooled by the air;
   wherein the corrugated deflector deflects substantially all of the air and causes turbulence in the air such that upon a failure of one of the plurality of fans the plurality of electronic circuits will continue to be cooled by the air.

8. The fail safe system for cooling electronic components of claim 7 further comprising a plurality of exhaust blowers coupled to the chassis.

9. The fail safe system for cooling electronic components of claim 7 wherein the corrugated deflector is curved.

10. The fail safe system for cooling electronic components of claim 9 wherein the corrugated deflector has pointed grooves.

11. The fail safe system for cooling electronic components of claim 9 wherein the corrugated deflector has square grooves.

12. The fail safe system for cooling electronic components of claim 9 wherein the corrugated deflector has curved grooves.

13. The fail safe system for cooling electronic components of claim 12 wherein the corrugated deflector has parallel grooves.

14. The fail safe system for cooling electronic components of claim 7 wherein the corrugated deflector has parallel grooves.

15. A fail safe system for cooling electronic components comprising:
   a corrugated deflector coupled to a chassis;
   a directional air deflector coupled to the chassis;
   a plurality of fans coupled to the chassis, positioned such that they cause air to come in contact with the corrugated deflector and the directional air deflector; and
   a plurality of electronic components;
   wherein the plurality of electronic components is cooled by the air;
   wherein the corrugated deflector and the directional air deflector deflect substantially all of the air and cause turbulence in the air such that the plurality of electronic circuits will be cooled by the air upon a failure of one of the plurality of fans.

16. The fail safe system of claim 15 further comprising an electronic circuit electronically coupled to the plurality of fans for adjusting a speed of the plurality of fans.

17. The fail safe system of claim 15 further comprising an exhaust blower coupled to the chassis.

18. The fail safe system of claim 15 wherein the directional air deflector redirects air moving horizontally and causes the air to move vertically.

19. The fail safe system of claim 18 wherein the directional air deflector redirects the air to predetermined hot spots.

* * * * *

UNITED STATES PATENT AND TRADEMARK OFFICE
CERTIFICATE OF CORRECTION

PATENT NO.    : 6,646,878 B2
DATED         : November 11, 2003
INVENTOR(S)   : Johni Chan It is certified that error appears in the above-identified patent and that said Letters Patent is hereby corrected as shown below:

<u>Column 8,</u>
Line 3, change "component" to -- components --.

Signed and Sealed this

Fifteenth Day of June, 2004

JON W. DUDAS
*Acting Director of the United States Patent and Trademark Office*